United States Patent [19]

Chang et al.

[11] 4,424,544
[45] Jan. 3, 1984

[54] OPTICALLY TOGGLED BIDIRECTIONAL SWITCH

[75] Inventors: Gee-Kung Chang, New Providence; Mahmoud A. El Hamamsy, Watchung; Adrian R. Hartman, New Providence; Orval G. Lorimor, Warren, all of N.J.

[73] Assignee: Bell Telephone Laboratories, Incorporated, Murray Hill, N.J.

[21] Appl. No.: 347,299

[22] Filed: Feb. 9, 1982

[51] Int. Cl.³ .............................................. H02H 9/00
[52] U.S. Cl. ........................................ 361/56; 361/91; 361/100
[58] Field of Search ................... 361/56, 91, 100, 101, 361/111, 13, 2; 307/200 B, 100

[56] References Cited

U.S. PATENT DOCUMENTS

| | | | |
|---|---|---|---|
| 3,504,233 | 3/1970 | Hurtle | 361/13 |
| 4,144,477 | 3/1979 | Eaton | 361/2 X |
| 4,217,618 | 8/1980 | Kellenbenz et al. | 361/111 X |
| 4,227,098 | 10/1980 | Brown et al. | 307/311 |
| 4,307,298 | 12/1981 | El Hamamsy et al. | 250/551 |
| 4,331,884 | 5/1982 | Svedberg | 361/91 X |

FOREIGN PATENT DOCUMENTS 2536077  3/1977  Fed. Rep. of Germany ........ 361/56

Primary Examiner—Reinhard J. Eisenzopf
Attorney, Agent, or Firm—Arthur J. Torsiglieri

[57] ABSTRACT

An optically toggled bidirectional normally-on switch is provided with protection against bilateral voltage and bidirectional current surges by the inclusion of a pair of oppositely poled thyristors. One version uses a large junction-type field-effect transistor in its main path and a pair of smaller junction-type transistors in the subsidiary path. A photodiode array controls the gate voltage on each of the transistors and turns them off when illuminated. A control node in the subsidiary path is connected to the gates of the SCRs so that excess current in this path turns on the appropriately-poled thyristor to provide an additional shunt path for the current.

21 Claims, 3 Drawing Figures

OPTICALLY TOGGLED BIDIRECTIONAL SWITCH

TECHNICAL FIELD

This invention relates to a normally-on solid-state switch. More particularly, the invention relates to such a switch which provides bilateral voltage blocking and bidirectional current flow, and which is protected against voltage or current surges which might damage the switch.

BACKGROUND OF THE INVENTION

There is growing interest in solid-state switches. In many applications subject to voltage and current surges, it is important to employ switches which are protected against such surges. It is, of course, desirable to provide such protection as conveniently and reliably as practical.

It is also desirable in many applications that the circuitry used to protect the switch develop its own voltage and not share, to any significant extent, current with the switch that it protects.

Additionally, for some applications it is desirable to have a normally-on switch which is highly linear over an operating range, and preferably symmetric about the origin of the voltage-current characteristic.

The present invention provides a normally-on switch which satisfies to a substantial extent these sought-for characteristics.

SUMMARY OF THE INVENTION

To this end the switch includes a main conduction path provided by one or more normally-on field-effect transistors connected between the two terminals of the switch and control circuitry, shunting the main path, including photovoltaic apparatus for controlling the conduction state of these transistors and a node whose voltage is a measure of the current flowing in the main path. This main path is further shunted by circuitry which protects the transistors against voltage and current surges and includes a pair of four-layer thyristors, sometimes also termed silicon-controlled rectifiers (SCRs), oppositely poled and essentially in parallel across the main path. The gates of the thyristors are connected to the node of the control circuitry so that the appropriately poled thyristor will be turned on if the current through the main path exceeds a threshold value. Additionally, the thyristors themselves can be chosen to provide some protection against voltage surges directly.

In one illustrative form, a switch in accordance with the invention includes a main normally-on field-effect transistor whose channel serves as the main conduction path of the switch and this transistor is shunted by a voltage dividing network, typically comprising a subsidiary pair of series-connected normally-on smaller field-effect transistors. The node between the two subsidiary transistors is connected by way of a photodiode array to the gates of both subsidiary transistors and the main transistor. Additionally, the main transistor is shunted by a pair in parallel of oppositely poled thyristors and each of the thyristors has its gate connected to the node between the subsidiary transistors. Various diodes advantageously are included ot block undesired sneak current paths and to provide desired voltage drops. In a low current switch the main transistor may be eliminated.

For the normally-on transistors, junction field-effect transistors (JFETs) are preferred, although depletion-type MOS field-effect transistors may also be used.

DETAILED DESCRIPTION

Figure 1:
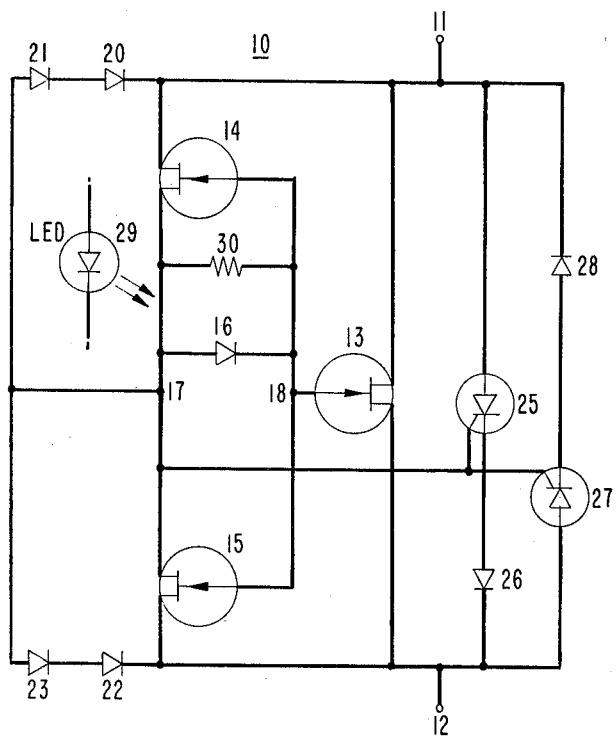
FIGS. 1–3 illustrate schematically different embodiments of normally-on switches in accordance with the invention.

In FIG. 1, a normally-on switch 10 is shown connected between terminals 11 and 12. Junction field-effect transistor 13 has its two current carrying electrodes, the source and drain, connected to terminals 11 and 12. Junction field-effect transistors 14 and 15 also have their conduction channels serially connected between terminals 11 and 12 by way of their current carrying electrodes. A light-sensitive element 16, typically an array of serially connected photodiodes, large enough to develop the desired control voltage, is connected between the first control node 17, to which are connected one terminal of each of transistors 14 and 15, and the second control node 18, to which are connected the gates of each of transistors 13, 14, and 15. A first pair of blocking diodes 20,21 is serially connected between the terminal 11 and node 17 and a second similar pair 22,23 is serially connected between terminal 12 and node 17. The first pair is poled to block when terminal 11 is positive, and the second when terminal 12 is positive. These serve to provide a path for charging the gate capacitance of transistor 13 when it is turned off. They also serve to reference node 17 to the more negative of terminals 11 and 12.

To provide the desired protection against current surges of either polarity, a first thyristor 25 in series with a blocking diode 26 and an oppositely poled second similar thyristor 27 in series with its blocking diode 28 are connected in parallel across terminals 11 and 12. Each of the thyristors has its gate electrode connected to the first control node 17. By this expedient, each is made to protect against current surges through transistor 13.

As a control means, a light emitting diode 29 is positioned so that its emission is incident on photodiode array 16. Control diode 29 is energized by a circuit separate from that of the switch to maintain electrical isolation between the control circuit including the LED and the controlled circuit, including the switch.

In the usual operation, the transistors are all normally on and conduction between terminals 11 and 12 is essentially by way of the lowest resistance path, provided by the channel of transistor 13. In a typical switch, the path by way of transistors 14 and 15 is designed to shunt relatively small currents even when these transistors are on and so they are provided with channels of considerably higher resistance than that of transistor 13. They then primarily serve as a voltage divider network to provide at node 17 a voltage intermediate that on terminals 11 and 12. Typically, transistors 14 and 15 are identical so that the voltage at node 17 is midway between that on terminals 11 and 12 when transistors 14 and 15 are on. As will be subsequently discussed, this voltage serves to provide control against current surges through transistor 13. In the typical application, transistors 14 and 15 will be much smaller than the main current-handling transistor 13 and so would be available in an integrated circuit structure at very little additional area penalty. However, for a high current switch, transistors 14 and 15 could be chosen to be large enough to handle substantial current. Also as will be discussed hereinafter, for a low current switch, it may be desirable to eliminate transistor 13, in which case the transistors 14 and 15 form the main conduction path between the terminals.

Similarly thyristors 25 and 27 are designed to be off when normal operating conditions are being maintained between terminals 11 and 12 so that they normally have little shunting effect.

When it is desired to open the switch to increase the resistance between terminals 11 and 12, LED 29 is energized to emit sufficient light that the optically coupled photodiode array 16 develops a sufficient voltage at node 17 for application to the gates of transistors 13, 14 and 15 that each gate is biased past pinchoff and the transistor becomes a high resistance. Accordingly, current therethrough is effectively limited to insubstantial levels. A large resistor 30 is connected across the photodiode array to facilitate discharge of the array and the FET gates once the light is turned off.

Branch paths between terminals 11 and 12 and the node 17 permit surge protection even when the transistors 13, 14 and 15 are nonconducting or off. These branch paths include the blocking diode pairs 20,21 and 22,23 to limit current flow in these paths during normal operation but to permit node 17 to reflect large changes in the voltages at either of terminals 11 and 12. In practice it was found important to use at least pairs of diodes rather than single diodes to ensure a voltage at node 17 sufficient to turn on the thyristors reliably when this action is called for.

As previously mentioned, when normal operating voltages exist across terminals 11 and 12, the voltages on the cathode and anode of the thyristor, together with the low voltage on its gate provided by node 17, are insufficient to permit conduction by either thyristor. In this case, the switch serves merely as a low resistance path between terminals 11 and 12, with relatively linear characteristics until saturation is reached with the resultant current limiting action. Moreover, because of the bilateral nature of the switch, the voltage current characteristic is symmetric about the origin.

In the event that the current through transistors 13, 14, and 15 becomes excessive, this is reflected in the voltage at node 17 which takes on a value sufficient to turn on the appropriate thyristor so that it can shunt some of this excess current.

Additionally in the event of a voltage surge of either polarity between terminals 11 and 12 sufficiently large to be dangerous, the appropriate thyristor 25 or 27 is turned on so that it can shunt currents that might otherwise flow entirely through the transistors. To turn on a thyristor, the applied voltage must also be sufficiently large that node 17 is biased to approximately two diode forward voltages above the more negative terminal. The two diodes establishing this voltage threshold are diode 26 and the gate-cathode diode of SCR25 or diode 28 and the gate-cathode diode of SCR27. In switch 10, since the voltage at node 17 is approximately one-half of the difference in voltage between terminals 11 and 12, the SCR25 or SCR27 turns on when a bias of approximately four forward diode drops (i.e., 2.8 V in silicon) is applied to the switch in its conducting state. By the inclusion of extra diodes, the voltage needed to turn on the thyristors can be increased to minimize premature turn-on. To turn on the thyristors it is also necessary that the current capability of the transistors 14 and 15 be greater than the gate currents of the thyristors. It is also preferable that the thyristors should not continue in a latched condition once the surges have subsided. Accordingly, the thyristors 25 and 27 are chosen to require relatively small gate currents for turn-on and yet need relatively high holding currents to stay on. This is achieved in a thyristor in which the internal current amplification of the gate current is sufficiently high.

In this embodiment, diodes 26 and 28 are included to block sneak paths that might be set up even when transistor 13 and the two thyristors are off, as a result of a breakdown of the cathode-gate junction of the reverse biased SCR. This breakdown typically can occur at relatively low voltages and it can result in the application of a voltage to the other thyristor sufficient to turn it on. The inclusion of diodes 26 and 28 prevents this and ensures that the breakdown voltage of the overall switch is determined by the breakdown characteristics of the transistors and the thyristors.

It will be appreciated that in this embodiment the thyristors provide protection independent of the state of the photodiode array and the state of the various transistors. Even when the transistors 13, 14 and 15 are in an OFF state, a dangerous voltage surge between terminals 11 and 12 will establish a large enough voltage between the cathode and anode and between the cathode and gate to turn the appropriate thyristor on.

It is also important, moreover, that the thyristors not turn on prematurely and that accordingly they be designed to be resistant to dV/dt effects known to workers in this art. This characteristic and a large holding current can be realized as known to workers in the art by providing a gate-cathode shunt in the thyristor.

Figure 2:
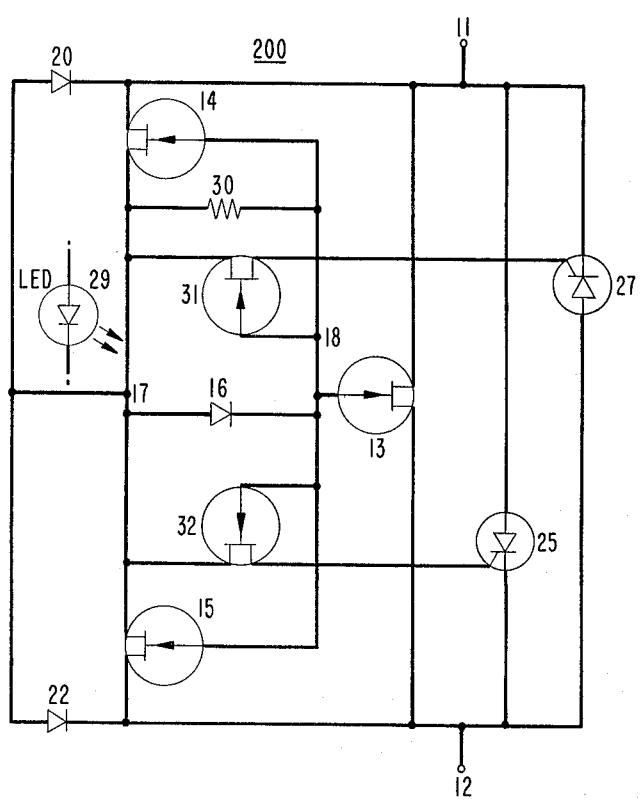

The switch 200 shown in FIG. 2 is an embodiment of the invention which can have a lower current surge state voltage drop and may be easier to integrate than the embodiment shown in FIG. 1. The same reference numerals have been used to designate corresponding elements in the two figures.

The differences are achieved by eliminating blocking diodes 26,28 associated with thyristors 25,27 in the switch of FIG. 1 and the substitution therefor of junction field-effect transistors 31,32 which are readily integrable with the other transistors of the switch. The absence of diodes 26 and 28 reduces the voltage needed across terminals 11 and 12 to turn the thyristors on and reduces the voltage drop across the thyristors during a current surge. Moreover, their absence also permits the elimination of diodes 21, 23 since operation with a lower voltage at node 17 should now be possible.

Transistor 31 is disposed so that its conduction channel provides a normally conductive path between the gate of thyristor 27 and the first control node 17 and its gate is connected to the second control node 18. Transistor 32 is disposed so that its conduction channel provides a normally conductive path between the gate of thyristor 25 and node 17 and its gate is connected to node 18. In this circuit, transistors 31 and 32 are normally conducting and provide the same function as the blocking diodes 26 and 28 so long as no light is incident on the photodiode array 16. When the photodiode array is energized, transistors 31 and 32 will be biased into pinchoff and will no longer conduct.

Figure 3:
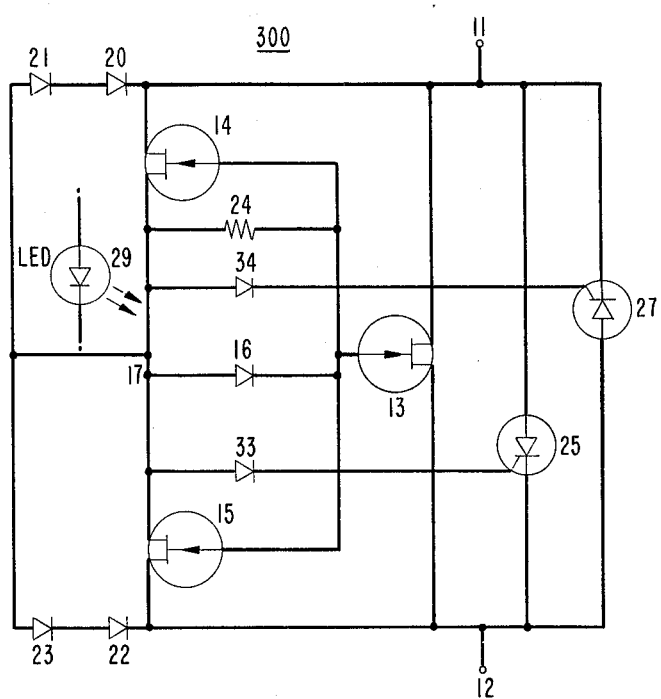

FIG. 3 illustrates an embodiment 300 of the normally-on switch which combines some of the advantages of the embodiments 10 and 200 shown in FIGS. 1 and 2, respectively. In this figure too, elements common to the FIG. 1 embodiment have used the same reference numerals. In this embodiment, to avoid sneak paths, blocking diode 33 is connected in the path between the gate of thyristor 25 and the control node 17 and blocking diode 34 is connected in the path between the gate of thyristor 25 and the control node 17. By this expedient, there is avoided the extra diode voltage drop required between terminals 11 and 12 to turn on the thyristors in the embodiment of FIG. 1, and there is also eliminated the need for the extra transistors 31,32 included in the embodiment of FIG. 2. However, there is an increase in the voltage needed at control node 17 in the manner of the embodiment of FIG. 1. By adding additional diodes in series with these, there can be increased the voltage at which the thyristor fires. This can be used to widen the normal operating range without excessively increasing the power dissipation.

As was earlier mentioned, in switches adopted to be normally on, it is advantageous to utilize junction-type field-effect transistors because such transistors are normally on in the absence of a voltage on the gate large enough to pinchoff the conduction channel. However, there are available MOS transistors known as the depletion type which are normally conducting and require a voltage on the gate to deplete the channel and render it nonconducting. It will be obvious to a worker in the art that these embodiments may be readily modified to use such depletion-mode MOS transistors in place of the junction-type FETs.

In each of these high current embodiments, a single layer transistor formed the main conduction path between the terminals, and a pair of smaller transistors were used to provide a control node while shunting relatively small currents from the main path. It can be appreciated that, in applications where only modest currents are normally to be drawn, it should be possible to utilize such parallel pair as the primary conduction path and to eliminate the single large transistor. In particular, in any of the embodiments shown in FIGS. 1-3, it would be feasible to eliminate transistor 13 if its current-handling capacity is not needed.

It can be appreciated that a variety of other embodiments may be devised consistent with the spirit and scope of the invention.

In addition it should be apparent that many of the elements of the switches described can be integrated in a monolithic integrated circuit.

It is known that is some instances a five-layer triac may be used as an equivalent for a parallel pair of oppositely poled four-layer thyristors to achieve bilateral breakdown characteristics since such a triac may be viewed as a merger of the two thyristors. Accordingly, in some instances it may be feasible to merge the two thyristors described in the specific embodiments into a single fivelayer device provided with appropriate gate connections to provide bilateral properties.

Moreover, it should be apparent that if protection were required only for voltage and current surges of a single polarity it would be feasible to employ only a single thyristor of the appropriate polarity for protection.

Similarly, in many applications, the normal operating voltages applied between terminals 11 and 12 will tend to remain of a single polarity in which case the switch will be operating only unilaterally.

What is claimed is:

1. A normally-on switch comprising a pair of terminals,
   semiconductive circuit means connected between said terminals including a pair of serially connected normally-on field-effect transistors forming a current path between said terminals, the point between said two transistors forming a control node for providing controllable conduction between said terminals and including photovoltaic means for switching the state of conduction, and
   protective circuit means connected between said terminals for protecting the semiconductive circuit means against current or voltage surges including at least one thyristor connected essentially in parallel between said terminals, the gate of each being effectively connected to said control node.

2. A switch in accordance with claim 1 in which the protective circuit means comprises a pair of oppositely poled thyristors.

3. A switch in accordance with claim 2 in which each gate of the thyristor is connected to the control node by way of the conduction path of a separate normally-on field-effect transistor, the gate electrodes of which are connected to the gate electrodes of the earlier-mentioned transistors.

4. A switch in accordance with claim 3 in which the photovoltaic means includes photodiode means connected between the control node and the gates of the five transistors and of the thyristors.

5. A switch in accordance with claim 1 in which the semiconductive circuit means further includes a single normally-on field-effect transistor connected to form a conduction path in parallel with that of the serially connected pair, the gate electrodes of the three transistors being connected together.

6. A switch in accordance with claim 5 in which the photovoltaic means includes a photodiode means connected between the control node and the gates of the three transistors for controlling the conduction state of the three transistors.

7. A switch in accordance with claim 5 in which each of the transistors is a junction field-effect transistor.

8. A switch in accordance with claim 5 in which each transistor is a depletion-type MOS transistor.

9. A switch in accordance with claim 1 in which each of the transistors is a junction field-effect transistor.

10. A switch in accordance with claim 1 in which each transistor is a depletion-type MOS transistor.

11. A switch in accordance with claim 1 in which the gates of the thyristors are connected to the control node by way of the conduction path of a field-effect transistor.

12. A switch in accordance with claim 1 in which the gates of the thyristors are each connected to the control node by way of a separate diode means.

13. A switch in accordance with claim 1 in which the thyristors are in parallel between the pair of terminals and the gates of the thyristors are each connected to the control node by way of a separate diode means.

14. A normally-on switch in accordance with claim 1 in which each thyristor is connected in series with a diode between said terminals, the cathode of the thyristor being connected to the anode of the diode, and the gate of each thyristor is connected directly to the control node.

15. A normally-on switch in accordance with claim 9 in which the control node is connected to each terminal by a separate branch path, each branch path including blocking diode means.

16. A normally-on switch in accordance with claim 15 in which the gates of the thyristors are connected to the control node by way of a field-effect transistor.

17. A normally-on switch in accordance with claim 15 in which the gates of the thyristors are connected to the control node by way of diode means.

18. A normally-on switch in accordance with claim 15 in which each thyristor is connected in series with a diode between said terminals, the cathode of the thyristor being connected to the anode of the diode, and the gate of each thyristor is connected directly to the control node.

19. A normally-on switch comprising a pair of terminals, semiconductive circuit means including a pair of field-effect transistors connected serially between said terminals for providing controllable conduction between said terminals and including photovoltaic means for switching the state of conduction, the voltage at the node between said transistors providing a measure of the conduction, branch circuit means between said node and each terminal including blocking diode means, and protection circuit means across said terminals including at least one thyristor having its gate effectively connected to said node.

20. A normally-on switch in accordance with claim 19 in which the photovoltaic means is connected between the node and the gates of the field-effect transistors.

21. A normally-on switch in accordance with claim 20 in which the semiconductive circuit means includes an additional field-effect transistor in parallel between said terminals and its gate is connected to the gates of the pair of transistors.

* * * * *

UNITED STATES PATENT AND TRADEMARK OFFICE
CERTIFICATE OF CORRECTION

PATENT NO. : 4,424,544

DATED : January 3, 1984

INVENTOR(S) : Gee-Kung Chang, Mahmoud A. El Hamamsy, Adrian R. Hartman, and Orval G. Lorimor It is certified that error appears in the above-identified patent and that said Letters Patent is hereby corrected as shown below:

Column 1, line 67, "ot" should read --to--.  Column 4, line 57, "is", second occurrence, should read --its--.  Column 5, line 57, "fivelayer" should read --five-layer--.  Column 6, line 67, "9" should read --1--.

Signed and Sealed this

Seventeenth Day of April 1984

[SEAL]

Attest:

GERALD J. MOSSINGHOFF

Attesting Officer

Commissioner of Patents and Trademarks